(12) United States Patent
Chang et al.

(10) Patent No.: US 6,393,716 B1
(45) Date of Patent: May 28, 2002

(54) METHOD AND APPARATUS FOR TRANSPORTING SUBSTRATES IN OLED PROCESS

(75) Inventors: Yih Chang, Chung-Ho; Jung-Lung Liu, Hsin Chu Industrial Park; Chih-Jen Yang, Hsin Chu Industrial Park; Chih-Ming Kuo, Hsin Chu Industrial Park; Jih-Yi Wang, Hsin Chu Industrial Park; Tien-Rong Lu, Tainan, all of (TW)

(73) Assignee: Ritek Display Technology Co. (TW)

( * ) Notice: Subject to any disclaimer, the term of this patent is extended or adjusted under 35 U.S.C. 154(b) by 0 days.

(21) Appl. No.: 09/563,932

(22) Filed: May 4, 2000

(30) Foreign Application Priority Data

Apr. 20, 2000 (TW) ........................ 89206482 U
Apr. 21, 2000 (TW) ........................ 89107608 A

(51) Int. Cl.[7] .............................................. B65G 49/07
(52) U.S. Cl. .............................. 34/61; 34/402; 414/939
(58) Field of Search ........................... 34/61, 402, 403, 34/404, 405, 380, 389; 414/217, 939

(56) References Cited

U.S. PATENT DOCUMENTS 5,303,671 A * 4/1994 Kondo et al. ............... 118/719
6,053,687 A * 4/2000 Kirkpatrick et al. ... 414/222.13
6,083,566 A * 7/2000 Whitesell .................... 118/695

* cited by examiner

*Primary Examiner*—Jiping Lu
(74) *Attorney, Agent, or Firm*—Lowe Hauptman Gilman & Berner, LLP

(57) ABSTRACT

A method and an apparatus for transporting substrates in an organic light emitting diode (OLED) process is disclosed, which has a transferring chamber provided for transporting substrates between processing modules and the atmosphere condition therein is able to be adjusted to be the same as the processing module by an atmosphere conditioner unit. According to the present invention, the substrates are not contaminated by moisture and the process operation and the factory layout are more flexible. Moreover, the OLED yield is improved.

20 Claims, 5 Drawing Sheets

METHOD AND APPARATUS FOR TRANSPORTING SUBSTRATES IN OLED PROCESS

BACKGROUND OF THE INVENTION

1. Field of the Invention

The present invention relates to a method and apparatus for transporting substrates in an organic light emitting diode (OLED) process.

2. Description of Related Art

In the manufacture of electronic devices, an issue is to promote efficiency and reduce cost by modifying processes, meanwhile the organic light emitting diode (OLED) which is one of the most significant display technologies still has many unresolved problems in mass production.

FIG. 1 shows the layout of a prior relevant display process, in which an unclosed transferring case 91 is moved between several independent closed processing modules such as pretreatment units 921, 921', panel preparation units 922, 922', deposition units of emitting materials 923, 923', deposition units of cathode materials 924, 924', and encapsulation units 925, 925'. In a conventional method and apparatus, the substrates are exposed to air and easily contaminated before and during transportatioii. Additionally, it's also necessary to adjust the enviroiunental condition of the processing module after the substrates arc moved therein, since the environmental conditions of the processing modules are changed while transporting substrates. Moreover, the organic emitting materials is highly moisture sensitive. The trace moisture in air leads to the degradation of organic materials and the failure of OLED. Therefore, there is a need for the above transporting procedure to be improved.

SUMMARY OF THE INVENTION

It is an object of the present invention to provide a method and an apparatus for transporting substrates in an OLED) process, so that the substrates can be reserved in desired environmental conditions to prevent atmosphere contamination and to improve the OLED yields, since the inside atmosphcre of a transferring chamber can be controlled.

It is another object of the present invention to provide a method and an apparatus for transporting substrates in an OLED process, so that the process operation and layout of the factory can be more flexible by moving the transferring chamber arbitrarily.

To achieve the above objects, it's necessary to adjust the environmental condition of the transferring chamber to be the same as the processing modules by an environmental conditioner. The environmental conditioner may itclude a pumping system, a gas regulator to input purified gas such as nitrogen or helium, and an atmosphere detector, which can control or detect the conditions of the transferring chamber, such as species, dew points and pressure of gas, moisture content, and temperature.

After the environmental condition of the transferring chamber is adjustcd as desired, the transferring chamber can commnunnicate with the desired processing module and the substrates can be transported in a closed space by a robot device. When finished, the transferring chamber can disconimunicate with the processing module, and be moved to next processing module.

The transforming chamber aforemenntioned has a vessel to contain substrates and at least a gate with a flange. The transferring chamber can be designed to have a door for cleaning or a window for inspecting. The transfenring chamber may be shifted on rails or a conveyor. The above processing module also has a vessel to construct a closed space and a gate with a flange, in which at least a processing module is contained.

In order to connect the transferring chamber and the processing module tightly, a connecting unit such as alignment elements or a positioning buffer having alignment elements and mounted on the gate of the processing module may be applied. The alignment elements can be any clamp, joint or connector able to fix the transferring chamber and maintain a closed space.

According to the substrate transporting method and apparatus of the present invention, the substrates can be transported and reserve in spccific environmental conditions to avoid contamination, since the inside atmosphere of the transferring chamber can be controlled. Furthermore, the process operation and layout of the OLED factory can be more flexible, since the transferring chamber can be moved arbitrarily.

Other objects, advantages, and novel features of the invention will become more apparent from the following detailed description when taken in conjunction with the accompanying drawings.

DETAILED DESCRIPTION OF THE PREFERRED EMBODIMENT

In an OLED process, the procedure for transporting substrates of the present invention may be different for the option of processing modules filled with different concentrations or species of gas. On the other hand, the arrangement of chambers used in the substrate transportation can be alternative. In order that the present invention may more readily be understood the following description is given, merely by way of examples with reference to the accompanying drawings.

Figure 1:
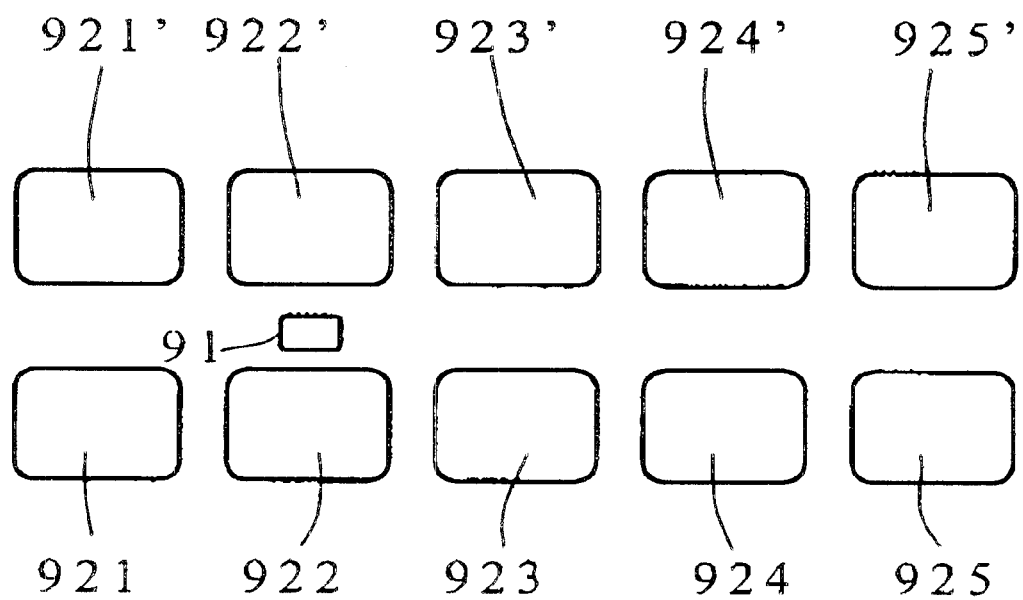
FIG. 1 is a layout of a prior relevant display process.
Figure 2:
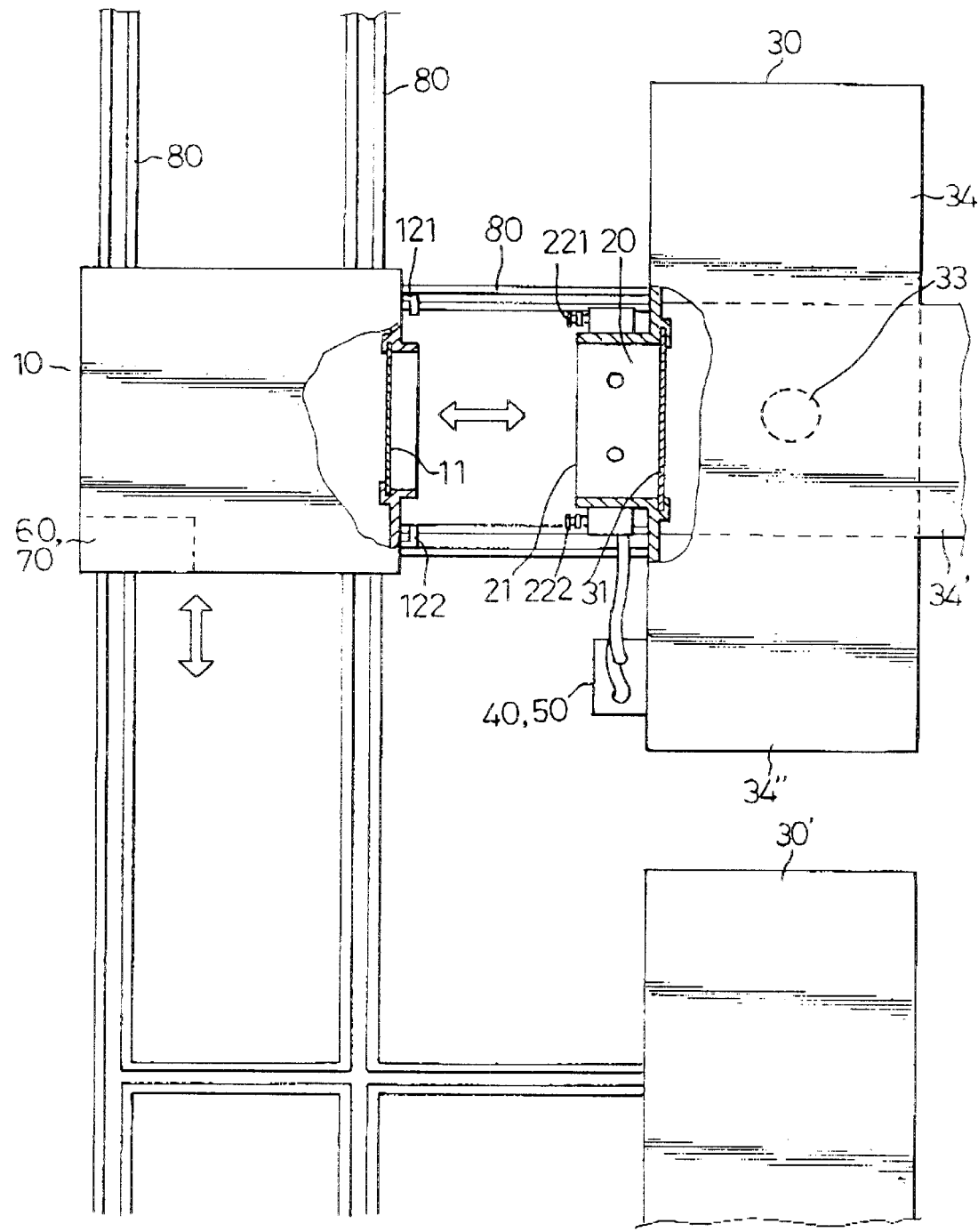
FIG. 2 is a top view or an apparatus for transporting substrates in OLED process of the present invention.

With reference to FIG. 2, an apparatus in an OLED process of the present invention primarily includes a transferring chamber 10 able to slide on rails 80 and a processing module 30. The transferring chamber 10 has a first vessel to construct a first closed space containing substrates, and therein contains an atmosphere detector 60 and an ionizer 70. The transferring chamber 10 also has a first flange with a first gate 11 on the first vessel. The processing modle 30 has a second vessel to form a second closed space in which three processing units 34, 34', 34" are contained, and a second flange with a second gate 31 on the second vessel. The processing units 34, 34', 34" are provided to perform the OLED process such as pretreatment units, panel preparation units, deposition units of emitting materials, deposition units of cathode materials or encapulation units. The processing module 30 also includes a robot device 33 therein. A positioning buffer 20 has a second end mounted on external side of the second gate 31 of the processing module 30 and a first end as a flange 21. The positioning buffer 20 also provide hooks 221, 222 as alignment elements to lock with rods 121, 122 of the transferring chamber 10. A pumping system 40 and a gas regulator 50 are located around the processing module 30 and connected to the positioning buffer 20 by pipes, which can control the inside atmosphere condition of the transferring chamber device 10.

Figure 3:
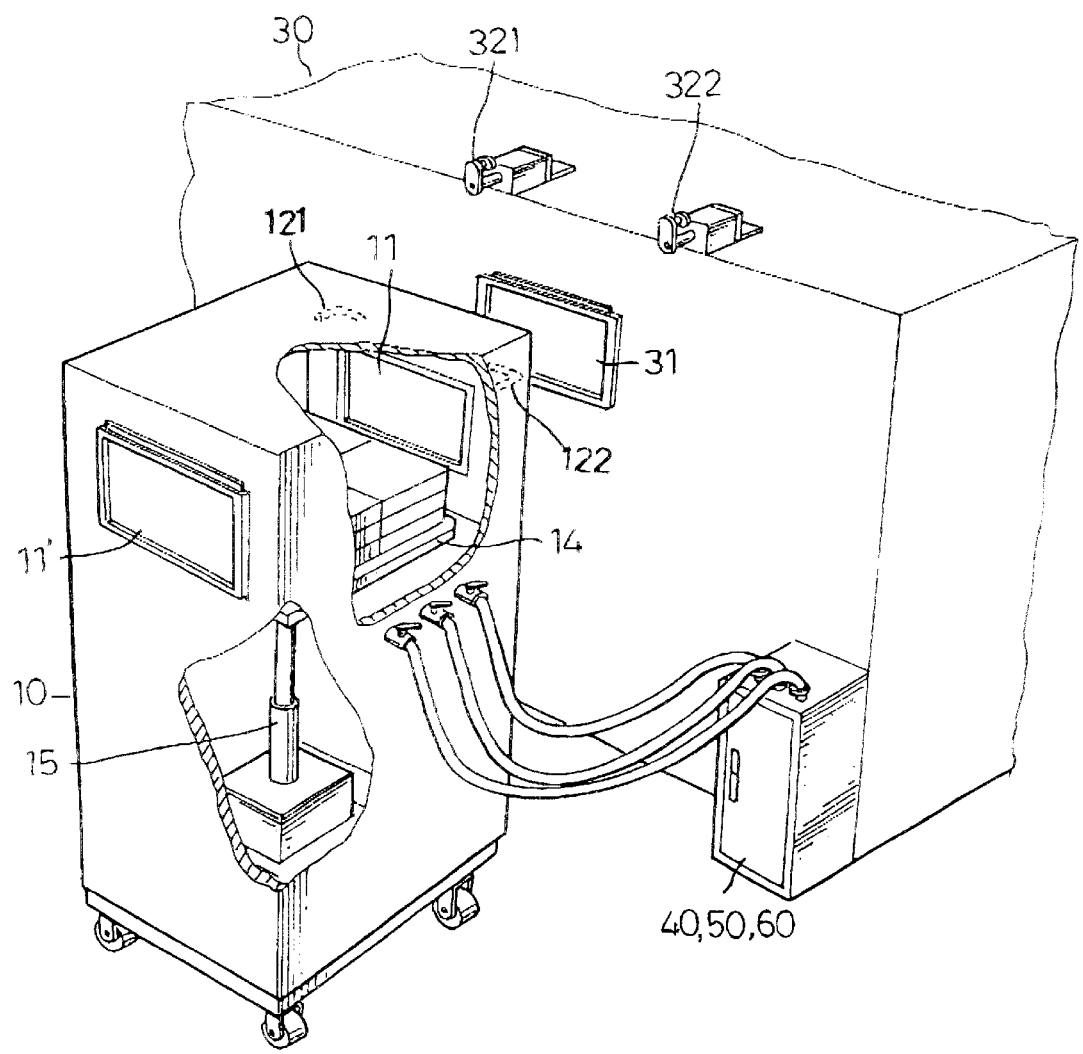
FIG. 3 is a top view of another apparatus for transporting substrates in OLED process of the present invention.

FIG. 3 shows another apparatus in an OLED process of the present invention, which is similar to that in FIG. 2. The differences between them are: (a) the processing module 30 without a positioning buffer has hooks 321, 322 as alignment elements to directly lock with rods 121, 122 of the transferring chamber 10, (b) the transferring chamber 10 has wheels able to be moved arbitrarily, (c) the transferring chamber 10 has two gates 11, 11' enabling substrates to be transported from different flanges as necessary, (d) the transferring chamber 10 has an elevator 15 to adjust a substrate stage 14 at a fit elevation, and (e) the pumping system 40, the gas regulator 50, and the atmosphere detector 60 located around the processing module 30 can be connected to the transferring chamber 10 by pipes.

Figure 4:
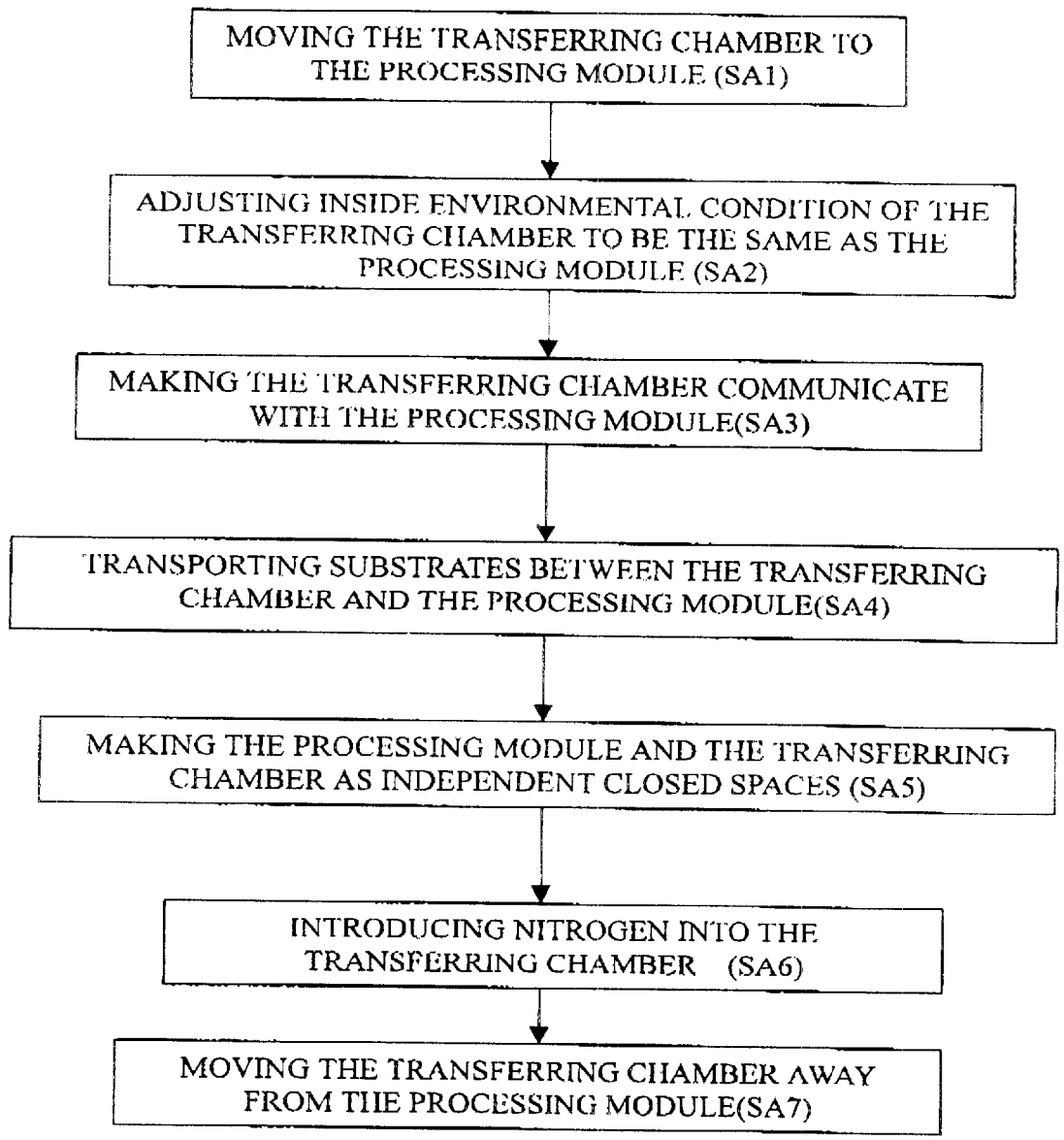
FIG. 4 is a flowchart of a method for transporting substrates in OLED process of the present invention.

FIG. 4 is a flowchart of the operating procedure in the present invention, in which the processing area 30 has hooks 321, 322 as alignment elements to lock directly with the rods 121, 122 of the transferring chamber 10 as shown in FIG. 3. Steps of the procedure are:

SA1: moving the transferring chamber 10 to the processing module 30 and locking hooks 321, 322 of the processing module 30 and the rods 121, 122 of the transferring chamber IO together;

SA2: adjusting the inside gas species and pressures of the transferring chamber 10 to be the same as the processing module 30 by a pumping system 40 and/or a gas regulator 50;

SA3: opening the first gate 11 and the second gate 31 to make the transferring chamber 10 communicate with the processing module 30;

SA4 : transporting substrates between the transferring chamber 10 and the processing module 30 by using a robot device 33;

SA5: closing the first gate 11 and the second gate 31 to make the transferring chamber discommunicate with the processing module and form two individual closed spaces;

SA6: pumping nitrogen into the transferring chamber 10 by a gas regulator 50; and SA7: moving the transferring chamber away from the processing module 30.

It should be noticed that the steps SA1 and SA2 can be optionally exchanged with each other, and the step SA6 can be neglected if the processing module 30 is filled with desired gas.

Figure 5:
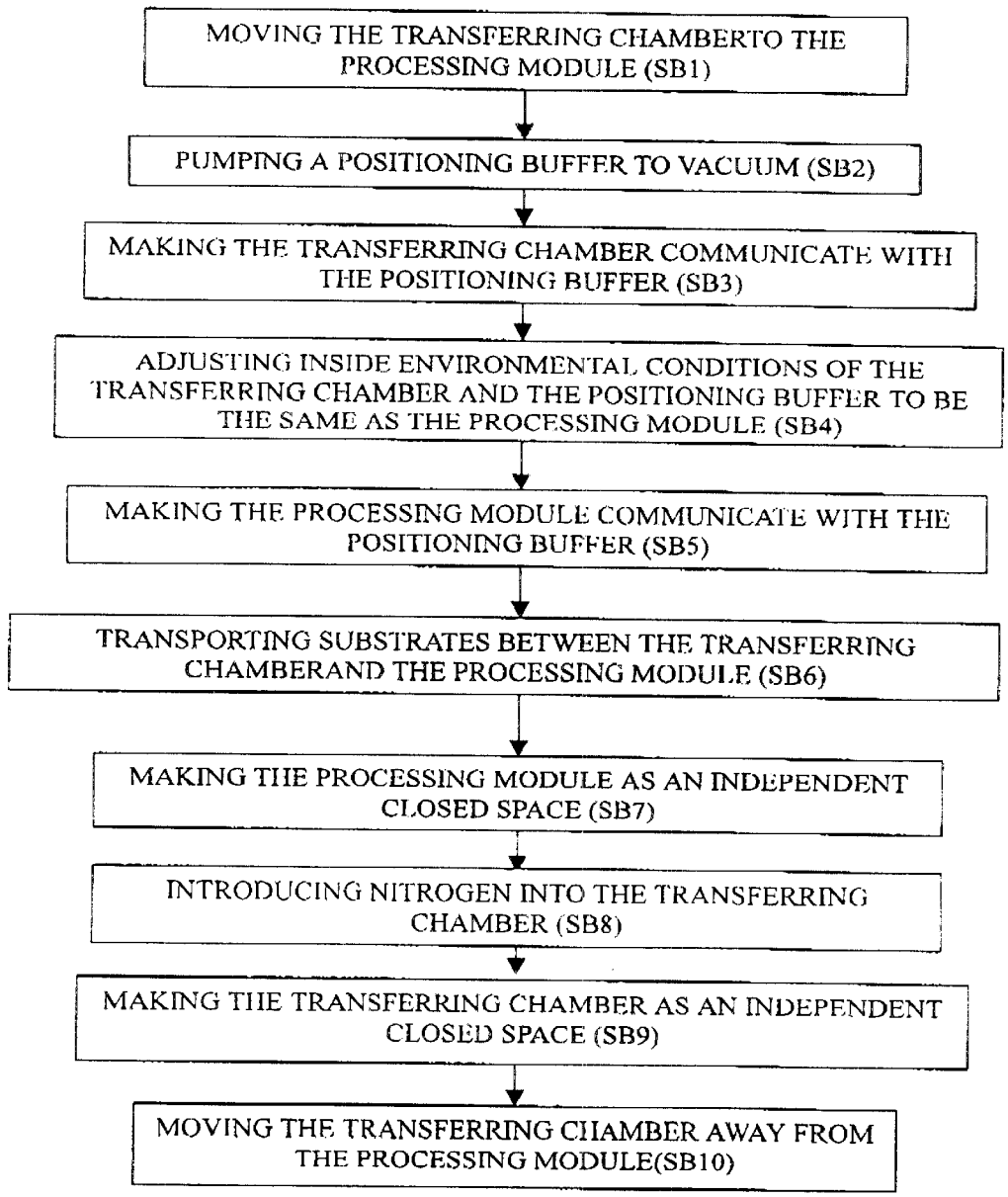
FIG. 5 is a flowchart of another method for transporting substrates in OLED process of the present invention.

FIG. 5 is a flowchart of another operating procedure in the present invention, which is similar to that in FIG. 4, but a positioning buffer 20 is provided on external side of the processing module 30 as shown in FIG. 2. Steps of the procedure are:

SB1: moving a transferring chamber IO to a processing module 30 and locking hooks 221, 222 of the buffer 20 and the rods 121, 122 of the transferring chamber 10 together;

SB2: pumping the positioning buffer 20 to desired vacuum by the pumping system 40;

SB3: opening the first gate 11 to make the transferring chamber 10 comuninlicate with the positioning buffer 20;

SB4: adjusting the inside gas species and pressures of the transferring chamber 10 and the positioning buffer 20 to be the same as the processing module 30 by the pumping system 40 or the gas regulator 50;

SB5: opening the second gate 31 to make the processing module 30 communicate with the positioning buffer 20;

SB6: transporting substrates between the transferring chamber 10 and the processing module 30 by the robot device 33;

SB7: closing the second gate 31 to make the processing module 30 as an independent closed space;

SB8: introducing nitrogen into the transferring chamber 10 by the gas regulator 50 through the positioning buffer 20; and SB9: closing the first gate 11 to make the tran.sferting chamber 10 an independent closed space; and SB10: moving the transferring chamber 10 away from the positioning buffer 20.

It should be noticed that the steps SB2 can be neglected if the transferring chamber 20 is filled with the desired gas, and the step SB8 can be neglected if the processing module 30 is filled with the desired gas.

According to the method and apparatus of the present invention, the substrates can be reserve and transported in desired environmental conditions to avoid atmosphere contamination, since the inside atmosphere of the transferring chamber can be controlled. Hence, the yield of OLED process can be improved. Furthermore, the operation and factory layout of the OLED process can be more flexible since the transferring chamber can be moved arbitrarily.

Although the present invention has been explained in relation to its preferred embodiments, it is to be understood that many other possible modifications atid variations can be made without departing from the spirit and scope of thie invention as hereinafter claimed.

What is claimed is:

1. An apparatus for transporting substrates in an organic light emitting diode (OLED) process, comprising:
    a transferring chamber having a first vessel to form a first closed space for containing substrates, said first vessel defining a first flange with a first gate;
    at least a processing module having a second vessel to form a second closed space, said second vessel defining a processing unit to perform said OLED process and a second flange with a second gate;
    a shifting unit for enabling said transferring chamber to move to said processing module and to align said first flange of said transferring chamber with said second flange of said processing module;
    a connecting unit to connect said first flange of said transferring chamber and said second flange of said processing module, so that said first closed space of said transferring chamber communicated with said second closed space of said processing unit, thereby forming a closed space; and
    an atmosphere conditioner unit to control environmental condition inside said transferring chamber.

2. The apparatus as claimed in claim 1 further comprising a substrate-receiving element to transport substrates between said transferring chamber and said processing module.

3. The apparatus as claimed in claim 2, wherein said substrate-receiving unit is a robot device.

4. The apparatus as claimed in claim 1, wherein said shifting unit has rails for said transferring chamber to slide thereon.

5. The apparatus as claimed in claim 1, wherein said connecting unit is a positioning buffer having one end mounted to an external side of said second gate of said processing module and the other end provided with alignment elements for tightly connecting to said transferring chamber.

6. The apparatus as claimed in claim 1, wherein said connecting unit is alignment elements.

7. The apparatus as claimed in claim 1, wherein said environment-controlling unit comprises a gas regulator.

8. The apparatus as claimed in claim 1, wherein said atmosphere conditioner unit comprises a pumping system.

9. The apparatus as claimed in claim 1, wherein said atmosphere conditioner unit comprises an atmosphere detector.

10. A method for transporting substrates in an organic light emitting diode (OLED) process, comprising the following steps:
    a. moving a transferring chamber to a processing module;
    b. adjusting atmosphere conditions inside said transferring chamber to be the same as inside of said processing module;
    c. communicating said transferring chamber and said processing module;
    d. transporting substrates between said transferring chamber and said processing module;
    e. discommunicating said transferring chamber and said processing module to form independent closed spaces; and
    f. moving said transferring chamber away from said processing module.

11. The method as claimed in claim 10, wherein said step a. is performed by using a shifting unit to move said transferring chamber.

12. The method as claimed in claim 10, wherein said step f. is performed by using a shifting unit to move said transferring chamber.

13. The method as claimed in claim 10, wherein said step a. is performed by using an atmosphere conditioner unit to adjust the inside environmental conditions of said transferring chamber.

14. The method as claimed in claim 10, wherein said step f. is performed by using an atmosphere conditioner unit to adjust the inside environmental conditions of said transferring chamber.

15. The method as claimed in claim 10, wherein said step c. is to performed by using a connecting unit to make said transferring chamber device communicate with said processing module.

16. The method as claimed in claim 10, wherein said step e. is performed by using a connecting unit able to make said transferring chamber discommunicate with said processing module.

17. The method as claimed in claim 10, wherein said step c. is performed by flange said gate of said transferring chamber.

18. The method as claimed in claim 10, wherein said step e. is performed by closing said gate of said processing module.

19. The method as claimed in claim 10, wherein said step b. can further adjust inside atmosphere conditions of a positioning buffer to be the same as inside of said processing module.

20. The method as claimed in claim 10 further comprising a step e1. following said step e. to fill a protecting gas into said transferring chamber to protect said substrates from moisture contamination.

* * * * *